US007836566B1

(12) United States Patent
Olsson et al.

(10) Patent No.: US 7,836,566 B1
(45) Date of Patent: Nov. 23, 2010

(54) MICROFABRICATED BULK WAVE ACOUSTIC BANDGAP DEVICE

(75) Inventors: Roy H. Olsson, Albuquerque, NM (US); Ihab F. El-Kady, Albuquerque, NM (US); Frederick McCormick, Albuquerque, NM (US); James G. Fleming, Albuquerque, NM (US); Carol Fleming, legal representative, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 12/764,700

(22) Filed: Apr. 21, 2010

Related U.S. Application Data

(62) Division of application No. 11/748,832, filed on May 15, 2007, now Pat. No. 7,733,198.

(51) Int. Cl.
*H01L 41/22* (2006.01)
*H04R 17/00* (2006.01)

(52) U.S. Cl. ...................................... 29/25.35; 333/187

(58) Field of Classification Search ................ 29/25.35; 333/187

See application file for complete search history.

(56) References Cited

U.S. PATENT DOCUMENTS 7,586,390 B2 * 9/2009 Matsumoto et al. ......... 333/187
2003/0029010 A1 * 2/2003 Aime ........................ 29/25.35

* cited by examiner

*Primary Examiner*—Rexford N Barnie
*Assistant Examiner*—Crystal L Hammond
(74) *Attorney, Agent, or Firm*—Kevin W. Bieg

(57) ABSTRACT

A microfabricated bulk wave acoustic bandgap device comprises a periodic two-dimensional array of scatterers embedded within the matrix material membrane, wherein the scatterer material has a density and/or elastic constant that is different than the matrix material and wherein the periodicity of the array causes destructive interference of the acoustic wave within an acoustic bandgap. The membrane can be suspended above a substrate by an air or vacuum gap to provide acoustic isolation from the substrate. The device can be fabricated using microelectromechanical systems (MEMS) technologies. Such microfabricated bulk wave phononic bandgap devices are useful for acoustic isolation in the ultrasonic, VHF, or UHF regime (i.e., frequencies of order 1 MHz to 10 GHz and higher, and lattice constants of order 100 μm or less).

11 Claims, 12 Drawing Sheets

MICROFABRICATED BULK WAVE ACOUSTIC BANDGAP DEVICE

CROSS-REFERENCE TO RELATED APPLICATION

This is a divisional application of application Ser. No. 11/748,832, filed May 15, 2007 now U.S. Pat. No. 7,733,198, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to phononic technologies and, in particular, to a bulk wave acoustic bandgap device that can be fabricated using microelectromechanical systems technologies.

BACKGROUND OF THE INVENTION

An acoustic bandgap (ABG) is the phononic analog of a photonic bandgap (PBG), wherein a range of acoustic frequencies are forbidden to exist in a structured material. ABGs are realized by embedding periodic scatterers in a host matrix that propagates an acoustic wave. The scatterer material has a density and/or elastic constant that is different than that of the matrix material, leading to destructive interference of the acoustic wave when the lattice constant of the phononic crystal structure is comparable to the wavelength of the acoustic wave. If the interference is destructive, the energy of the acoustic wave is reflected back and the wave cannot propagate through the phononic crystal. This destructive interference creates the ABG. In principle, the bandgap can be created at any frequency or wavelength simply by changing the size of the unit cell of the crystal. The spectral width of the ABG is directly related to the ratio of the densities and sound velocities in the different materials comprising the structure. In general, the larger the ratio, the wider the bandgap. For example, the bandwidth of an ABG-based acoustic isolator, $\Delta\omega$, can exceed 0.5 $\omega_g$, where $\omega_g$ is the center (midgap) frequency of the ABG. See M. M. Sigalas and E. N. Economou, *J. Appl. Phys.* 75, 2845 (1994). This wide bandwidth distinguishes ABG acoustic isolators from previously developed one-dimensional quarter-wave acoustic reflectors. Further, for two- or three-dimensional phononic crystals, the frequency and width of the bandgap will depend on the direction of propagation.

Most of the prior ABG work has been limited to large, hand-assembled structures at frequencies below 1 MHz (i.e, structures with lattice constants of order one millimeter or greater), where the ABG matrix material was either water or epoxy. See T. Miyashita, *Meas. Sci. Technol.* 16, R47 (2005). Investigation of higher frequency ABGs in solid low-loss materials has recently been reported for surface acoustic wave (SAW) devices where ABGs have been demonstrated at 200 MHz by etching air hole scatterers in lithium niobate and silicon. See S. Benchabane et al., *Proc. of SPIE* 6128, 61281A-1 (2006); and T. Wu et al., "*J. Appl. Phys.* 97, 094916 (2005).

However, there remains a need for bulk wave acoustic bandgap (BAW ABG) devices fabricated using microelectromechanical systems (MEMS) technologies. Such microfabricated BAW ABG devices would be useful for acoustic isolation of devices operating in the ultrasonic, VHF, or UHF regime (i.e., frequencies of order 1 MHz to 10 GHz and higher, and lattice constants of 100 μm or less), such as radio frequency (rf) resonators and gyros. By defecting the acoustic bandgap device through removal or modification of the scatterers, microscale phononic elements, such as waveguides, couplers, high-Q cavities, filters, mirrors, and lenses, can be realized, enabling phononic integrated circuits and impacting fields such as communications, ultrasound, and non-destructive testing. Further, microscale BAW devices have several significant advantages over SAW approaches. In SAW devices, energy can leak into the substrate, introducing loss in cavities and waveguides. Conversely, BAW ABG devices can be placed in vacuum and acoustically isolated from the substrate, completely confining the acoustic energy inside a two-dimensional ABG device. Other advantages of the microfabricated BAW ABG devices are small size and compatibility with conventional complementary-metal-oxide-semiconductor (CMOS) fabrication processes.

SUMMARY OF THE INVENTION

The present invention is directed to a microfabricated bulk wave acoustic bandgap device, comprising a substrate; a membrane comprising a matrix material, suspended above the substrate, that propagates an acoustic wave; and a two-dimensional periodic array of scatterers embedded within the matrix material, wherein the scatterer material has a density and/or elastic constant that is different than the matrix material and wherein the periodicity of the array causes destructive interference of the acoustic wave within an acoustic bandgap.

The scatterer material preferably has a higher density and acoustic velocity than the matrix material. The array preferably has a cermet topology. The volume filling fraction of the scatterers in the matrix is preferably approximately 0.3. The device can be fabricated using MEMS materials and technologies. For example, the substrate can comprise silicon, the matrix material can comprise silicon dioxide, silicon, or polymer, and the scatterer material can comprise tungsten. The periodic array can comprise a square lattice with a periodicity of less than 100 microns.

Phononic elements can be realized by breaking the periodicity of the acoustic bandgap device to create highly localized defect or guided modes within the acoustic bandgap. For example, such phononic elements can comprise a waveguide, a splitter, or a channel drop filter.

The invention further comprises a method for fabricating a bulk wave acoustic bandgap device. The method comprises providing a substrate; forming a release layer on the substrate; forming a matrix layer comprising a matrix material on the release layer; forming a two-dimensional periodic array of scatterers within the matrix material, wherein the scatterer material has a density and/or elastic constant that is different than the matrix material; and removing the release layer to release a membrane comprising the matrix material and the periodic array of scatterers within the matrix material, wherein the periodicity of the array causes destructive interference within an acoustic bandgap of an acoustic wave that propagates in the membrane.

A number of microfabricated bulk wave acoustic bandgap devices were designed and characterized to demonstrate the invention. These exemplary devices comprised high-impedance, high-density tungsten scatterers in a low-density, low-acoustic impedance $SiO_2$ matrix membrane. Integrated AlN piezoelectric couplers were used to launch and detect longitudinal acoustic waves in the membrane and characterize the acoustic bandgap. BAW ABG devices were fabricated with lattice constants of 45 μm and 90 μm, corresponding to acoustic bandgaps at 67 MHz and 33 MHz, respectively. These devices were experimentally characterized and had maximum acoustic attenuations greater than 30 dB. Gap widths as large as a third of the gap center frequency were measured.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 1:
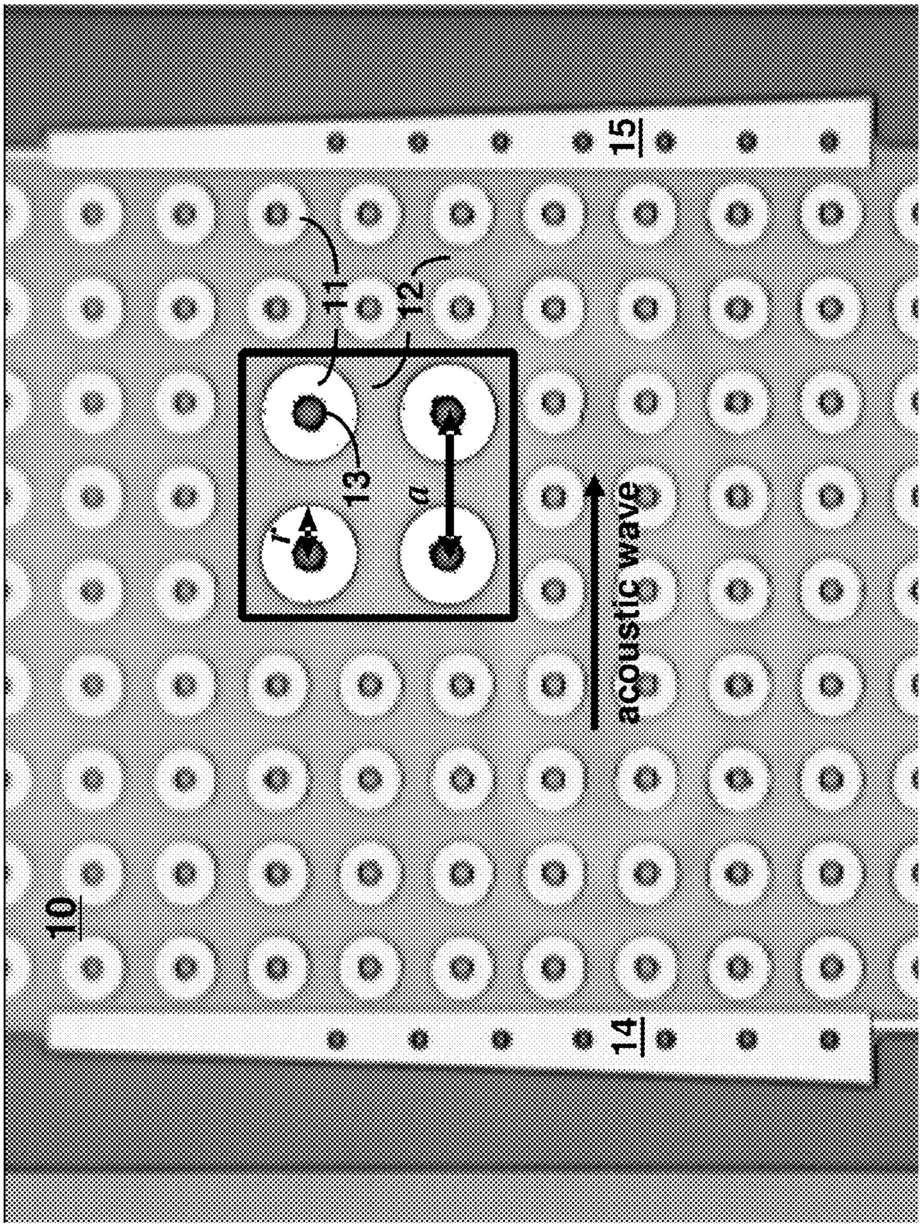
FIG. 1 shows a top-view photograph of a microfabricated bulk wave acoustic bandgap device with integrated piezoelectric couplers. This device has a center frequency of about 67 MHz

In FIG. 1 is shown a top-view photograph of an exemplary microfabricated BAW ABG device 10, according to the present invention. This exemplary device 10 comprises nine layers (periods) of aluminum-capped tungsten scatterers 11 arranged in a two-dimensional square-lattice array embedded in a silicon dioxide ($SiO_2$) host matrix 12. The matrix 12 comprises a thin membrane that is suspended above an underlying silicon substrate (not shown) to provide acoustic isolation from the substrate. The scatterers 11 comprise parallel cylinders, or rods, having cylindrical axes perpendicular to the plane of the membrane. The inset shows a close-up image of aluminum-capped tungsten scatterers 11 and release holes 13. Acoustic energy is coupled into and out of the device 10 in the form of longitudinal acoustic waves (i.e., compression waves) using integrated aluminum nitride (AIN) piezoelectric couplers 14 and 15. The couplers 14 and 15 are tapered on the end to provide a wide bandwidth drive and sense. In this exemplary device 10, the acoustic waves propagate in the parallel direction to the lattice. For waves propagating in parallel to the lattice direction, the period is equal to the lattice constant.

Figure 2:
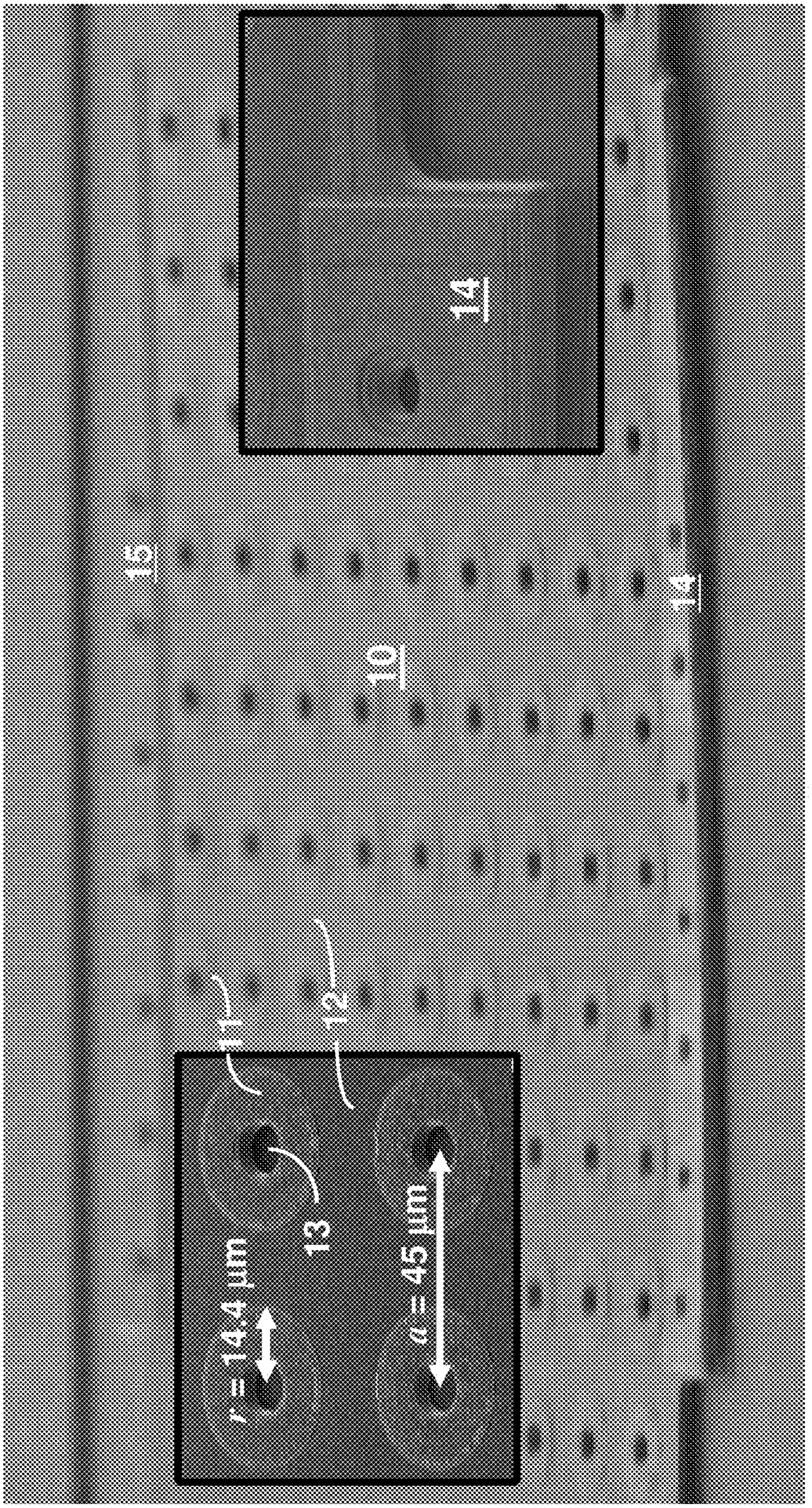
FIG. 2 shows a top-view scanning electronic micrograph of the bulk wave acoustic bandgap device shown in FIG. 1.

In FIG. 2 is shown a top-view scanning electron micrograph (SEM) of the BAW ABG device 10 shown in FIG. 1. The left inset shows a close-up SEM of aluminum-capped tungsten scatterers 11 in the $SiO_2$ matrix 12. For this exemplary device, the lattice constant, a, is 45 μm and the scatterer radius, r, is 14.4 μm. The volume filling fraction is r/a=0.32. The release holes 13 in the center of the tungsten scatterers 11 have a radius of 5 μm. The right inset shows a close-up SEM of an AIN coupler 14. This device 10 has a center frequency, $\omega_g$, of 67 MHz. Acoustic frequencies inside the acoustic bandgap of the device 10 cannot propagate between the two AIN couplers 14 and 15.

Figure 3:
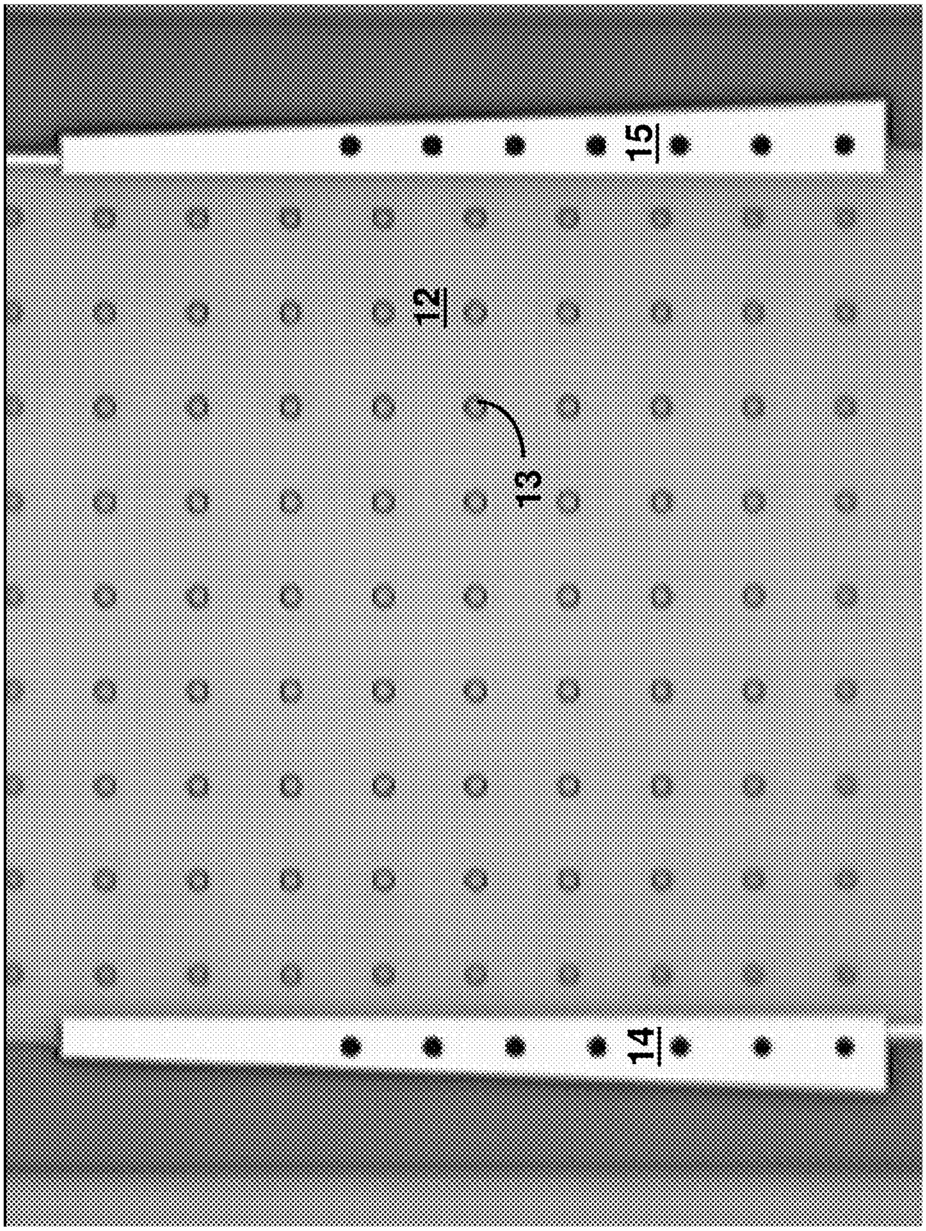
FIG. 3 shows a top-view photograph of a matrix membrane with piezoelectric couplers.

In FIG. 3 is shown a top-view photograph of a suspended membrane, comprising a homogeneous, isotopic $SiO_2$ host matrix 12 with release holes 13 but without any scatterers, and piezoelectric couplers 14 and 15. This matrix membrane does not display an ABG and was used as a comparison to characterize the BAW ABG device shown in FIG. 1.

To produce an acoustic bandgap spanning a wide frequency range with a high magnitude of acoustic isolation there are several important criteria that should be followed. First, a cermet topology of isolated high-density inclusions (scatterers) embedded in a low-density host matrix is preferred with as high a density contrast as possible between the scatterers and the host matrix materials. Using a cermet topology to achieve wide acoustic bandgaps in a phononic crystal is opposite to photonic crystals, wherein a network topology of scatterer material that is connected and forms a continuous network throughout the structure is preferred to achieve wide electromagnetic bandgaps. See E. Economou and M. Sigalas, *Phys. Rev. B.* 48, 13434 (1993).

The second important criteria is that the scatterers and the matrix preferably have as high an acoustic impedance mismatch as possible, and more preferably with the scatterers having the higher acoustic impedance. The acoustic impedance of a material is $$Z=c\rho, \tag{1}$$

where c is the acoustic velocity and ρ is the density. Etching hole inclusions in a solid matrix, as has been demonstrated in prior microscale ABG devices, places low-density, low-impedance scatterers in a high-density, high-impedance matrix, resulting in narrower gaps with lower isolation. See S. Benchabane et al.; and T. Wu et al.

Finally, the volume filling fraction of the high-density, high-impedance scatterers is preferably approximately 0.3. See M. M. Sigalas and E. N. Economou. If the filling fraction is too low, transmission through the matrix material around the scatterers can occur. If the filling fraction becomes too high, hopping between the scatterers leads to acoustic transmission. Finite-difference-time-domain (FDTD) simulations indicate the optimal ratio for the square lattice is 0.32.

In addition to a square lattice, other two-dimensional periodic lattice structures can also be used, such as hexagonal, triangular, or honeycomb. In addition to cylindrical scatterers, other scatterer shapes can also be used, such as squares, triangles, diamonds, polygons, etc. FDTD simulations can be used to optimize the ABG for these other lattice symmetries and scatterer shapes.

Other material considerations include material damping and materials that are compatible with MEMS fabrication technologies and, preferably, silicon CMOS technologies. Tungsten is a good choice as the scatterer inclusion because of it high density, 19.3 kg/m$^3$, and high acoustic impedance, 89 MegaOhms (MΩ). Tungsten also has low material damping (quality factor, Q>$10^5$ at 273 K) and is widely used in CMOS contact structures. See W. Duffy Jr., *J. Appl. Phys.* 72(12), 5628 (1992). Other high-density, high-acoustic-impedance, low-material-damping MEMS materials can also be used for the scatterers, such as tungsten carbide, platinum, polycrystalline diamond, or molybdenum. Desired characteristics of the matrix material are low density and acoustic impedance, along with high acoustic velocity and Q. Polymers, such as SU-8, can provide a very high density and acoustic impedance mismatch with tungsten. The material damping of polymers, however, is high and the acoustic velocity is low, resulting in smaller structures for a given frequency. On the other end of the spectrum, silicon, either single crystal or polycrystalline, can be used as the matrix material. Quality factors exceeding $10^5$ have been achieved in microfabricated silicon resonators and the acoustic velocity is high. Of low-loss, high-velocity MEMS materials, $SiO_2$ and other silicate glasses have the largest density and impedance mismatch with tungsten and can provide wide bandgaps. However, other IC- or MEMS-compatible materials, such as gallium arsenide, gallium nitride, zinc oxide, lithium niobate, lithium tantalite, quartz, and silicon-germanium, can also be used as matrix materials. Table 1 summarizes the acoustic properties of some MEMS-compatible matrix materials.

TABLE 1

Some ABG matrix material properties

| Matrix | Density (kg/m$^3$) | Velocity (km/s) | Z (MΩ) | Q |
|---|---|---|---|---|
| Polymers (SU-8) | 1190 | 1.84 | 2.2 | Low |
| AlN | 3230 | 9.77 | 31.5 | High |
| Si | 2330 | 8.52 | 19.8 | Very High |
| $SiO_2$ | 2200 | 5.84 | 12.8 | High |

Fabrication of a Bulk Wave Acoustic Bandgap Device

In FIGS. 4A-4D is shown a schematic illustration of a method to fabricate the BAW ABG device, shown in FIGS. 1 and 2, using MEMS technologies. The details of the fabrication steps are not described herein, since cleaning, deposition, masking, photolithography, mask removal, etching, planarizing, etc. are well known in the art.

Figure 4A:
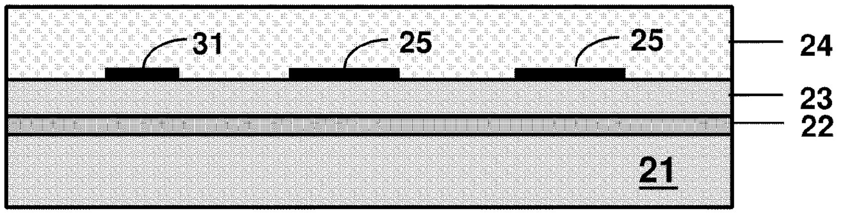
FIGS. 4A-4D show schematic cross-section views of a method to fabricate the BAW bandgap device shown in FIG. 1, using MEMS technologies.

In FIG. 4A, a thin etch-stop layer 22 is formed on a substrate 21. The substrate 21 can comprise any suitable substrate material that is compatible with the fabrication processing, such as silicon, semiconductor, glass, ceramic, or metal. The etch-stop layer 22 comprises a material that is insoluble in the release etch. For example, the etch-stop layer 22 can be a 0.6-μm thickness oxide layer that is thermally grown on a silicon substrate. Next, a release layer 23 is deposited on the etch-stop layer 22. The release layer 23 comprises a material that is soluble in the release etch. For example, the release layer 23 can be a 2-μm thickness layer of undoped polysilicon. Next, an electrical interconnect layer is deposited and patterned on the release layer 23. For example, the interconnect layer can be a 0.4-μm thickness aluminum layer that is sputter deposited and patterned using standard lithography. The patterned interconnect layer 25 provides for an electrical interconnection 31 to the piezoelectric coupler 14 and also serves to protect the bottoms of the scatterers 27 during the release etch. A matrix layer 24 is formed on the patterned interconnect layer 25 and the exposed release layer 23. For example, the matrix layer 24 can be formed by plasma-enhanced tetraethylorthosilicate (PETEOS) deposition of a 4-μm thickness oxide layer on the patterned aluminum interconnect layer and the exposed polysilicon release layer. The matrix layer 24 can be subsequently polished to remove the surface topography created by the underlying patterned interconnect layer 25.

Figure 4B:
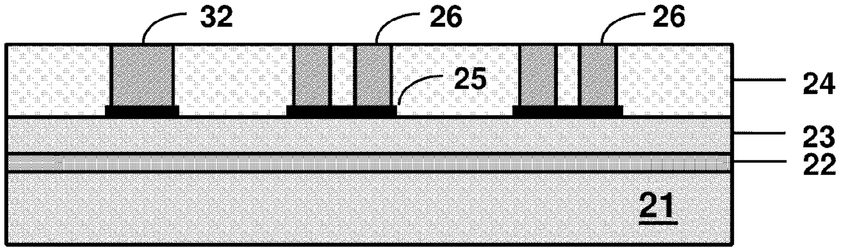

In FIG. 4B, trenches are etched through the matrix layer 24 to the interconnect layer 25 followed by conformal deposition of the scatterer material to form plugs 26 and 32 in the trenches. For example, 2-μm wide trenches can be etched through the oxide matrix layer, followed by conformal deposition of the tungsten scatterer material into the open trenches. The scatterer material layer can be polished, for example by chemical-mechanical polishing (CMP), until it remains only in the trenches that were etched in the matrix layer 24. The plug material forms an electrical contact 32 from the electrical interconnection 31 to the bottom electrode 33 of the integrated piezoelectric coupler 14 and also forms a portion 26 of the high-density scatterer inclusions 27.

Figure 4C:
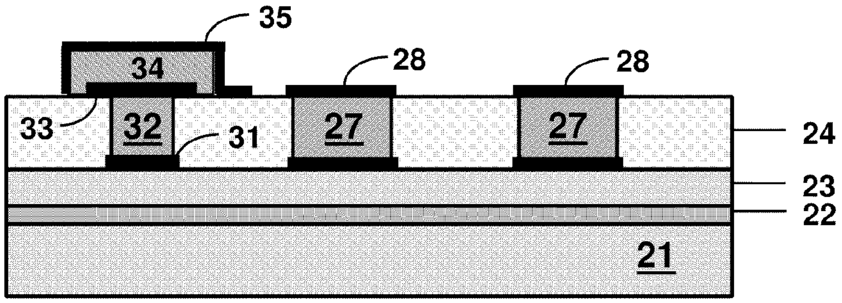

In FIG. 4C, the filling of the scatterers 27 can be completed by repeating the matrix layer etch, scatterer material deposition, and polishing, if desired. Next, a piezoelectric coupler bottom electrode 33 is deposited and patterned, followed by deposition and patterning of an oriented piezoelectric layer 34. For example, the bottom electrode 33 can be a deposited Ti/TiN/Al electrode. The piezoelectric coupler 14 provides an in-plane lateral displacement for electrical drive and sense. Therefore, the piezoelectric coupler layer 34 can be formed by the sputter deposition of 0.75-μm thickness of AlN. The AlN film can be highly c-axis oriented (e.g., x-ray diffraction rocking curve full-width-half-maximum of about 1.5), which results in strong piezoelectric coupling. The piezoelectric layer can be patterned and a top electrode 35 deposited on the patterned piezoelectric coupler layer 34. For example, the AlN can be patterned and a 0.4-μm thickness aluminum top electrode can be deposited on the patterned AlN coupler layer. Other suitable materials that can be used for the piezoelectric coupler 14 are, for example, zinc oxide (ZnO) and lead zirconate titanate (PZT, $PbZr_xTi_{1-x}O_3$). The top electrode layer can also provide caps 28 to protect the scatterers 27 during the release etch.

Figure 4D:
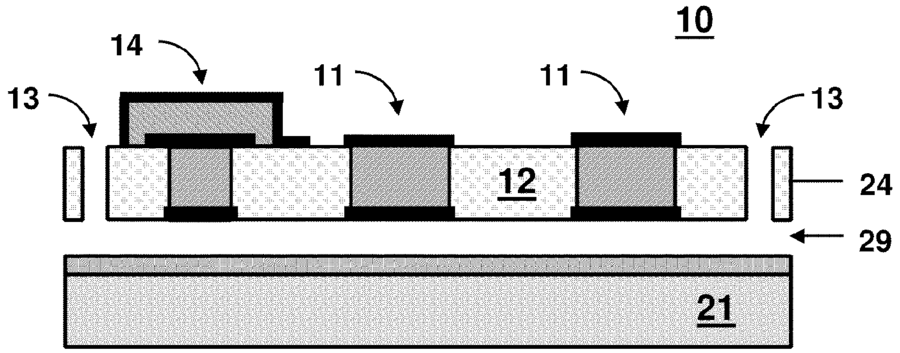

In FIG. 4D, release holes 13 are etched through the matrix layer 24 and the BAW ABG device 10 is released by etching the release layer 23. If the scatterers 11 are not completely filled, as shown in FIG. 4B, the release holes 13 can be etched through the center of the scatterers 11, as shown in FIG. 1. Alternatively, if the membrane 12 is narrow, it can be released by etching the release layer 23 from the sides. The etch-stop layer 22 prevents etching of the underlying substrate 21 during the release etch. For example, the release holes 13 can be etched through the oxide matrix layer down to the polysilicon release layer and the device can be released in dry sulfur hexafluoride ($SF_6$). Using a thin polysilicon release layer, as opposed to the silicon substrate, prevents etch loading during release and allows large structures to be released through small holes. The release etch leaves a thin membrane 12 that is suspended above the substrate 21 by a gap 29 that provides acoustic isolation from the substrate 21 when an acoustic wave propagates in the membrane 12. The membrane 12 can be suspended above the substrate 21 by thin tethers (not shown) at the ends of the membrane 12 perpendicular to the direction of propagation of the acoustic wave. The gap 29 minimizes acoustic energy loss from the membrane 12 to the substrate 21. Preferably, the gap 29 is an air or vacuum gap. Rather than a gap 29, the membrane 12 can be formed on a layer (not shown) comprising an acoustic reflector or a material that has an impedance mismatch with the scatterer and matrix materials. This exemplary fabrication method uses seven masks and, provided the polysilicon release layer is deposited at low temperature, is post-CMOS compatible.

When an oscillatory voltage is applied between the top electrode 35 and the bottom electrode 33 of the drive piezoelectric coupler 14, an in-plane extensional mechanical stress is produced in the piezoelectric material 34 that changes the width of the coupler in the direction substantially parallel to the membrane 12. This oscillation is coupled into the membrane 12 as an in-plane longitudinal acoustic wave. The membrane 12 comprises periodic scatterers 11 in a host matrix 24 that propagates the acoustic wave. The scatterer material has a density and/or elastic constant that is different than that of the matrix material, leading to destructive interference of the acoustic wave when the period of the scatterers 11 is comparable to the wavelength of the acoustic wave. If the interference is destructive, the energy of the acoustic wave is reflected back and the wave cannot propagate through the membrane 12 to the sense piezoelectric coupler 15. This destructive interference creates the ABG.

Characterization of a Bulk Wave Acoustic Bandgap Device

The acoustic response of the 9-layer, 67 MHz BAW ABG device shown in FIG. 1 was compared to that of the $SiO_2$ matrix membrane shown in FIG. 3. Both the device and membrane were tested on a probe station in air using a network analyzer, wherein the output of the network analyzer was used to launch an acoustic wave into the device via an AlN piezoelectric coupler. On the opposite side of the device, acoustic waves were detected using the other AlN coupler and fed into the sense input of the network analyzer.

Figure 5:
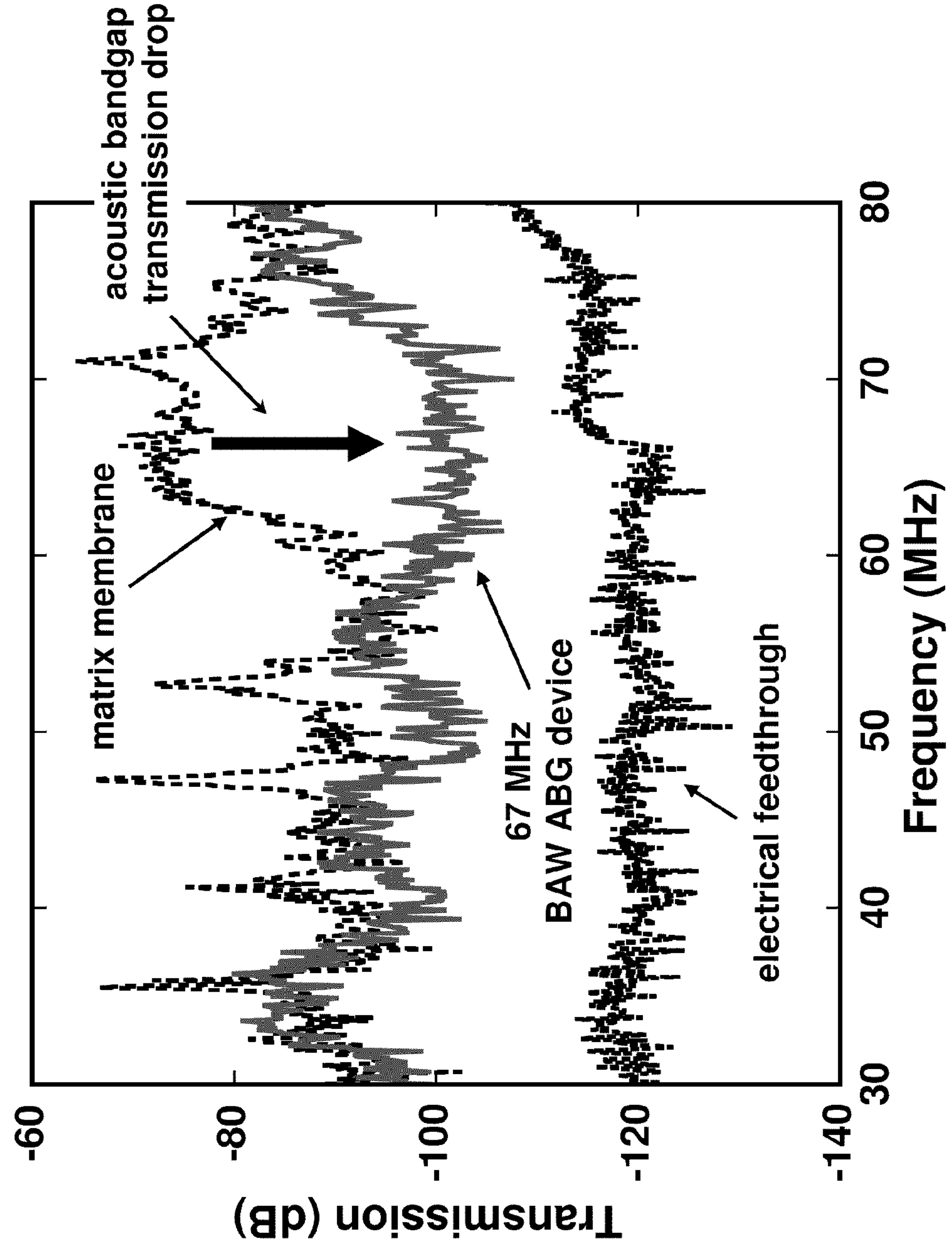
FIG. 5 shows a graph of the measured transmission for the 9-layer BAW ABG device shown in FIG. 1, the $SiO_2$ matrix shown in FIG. 3, and the electrical feed through between two unrelated pads of the test set up.

In FIG. 5 is shown a graph of the measured transmission for the BAW ABG device, shown in FIG. 1; the $SiO_2$ matrix membrane, shown in FIG. 3; and the electrical feed through between two unrelated pads of the test set up.

Figure 6:
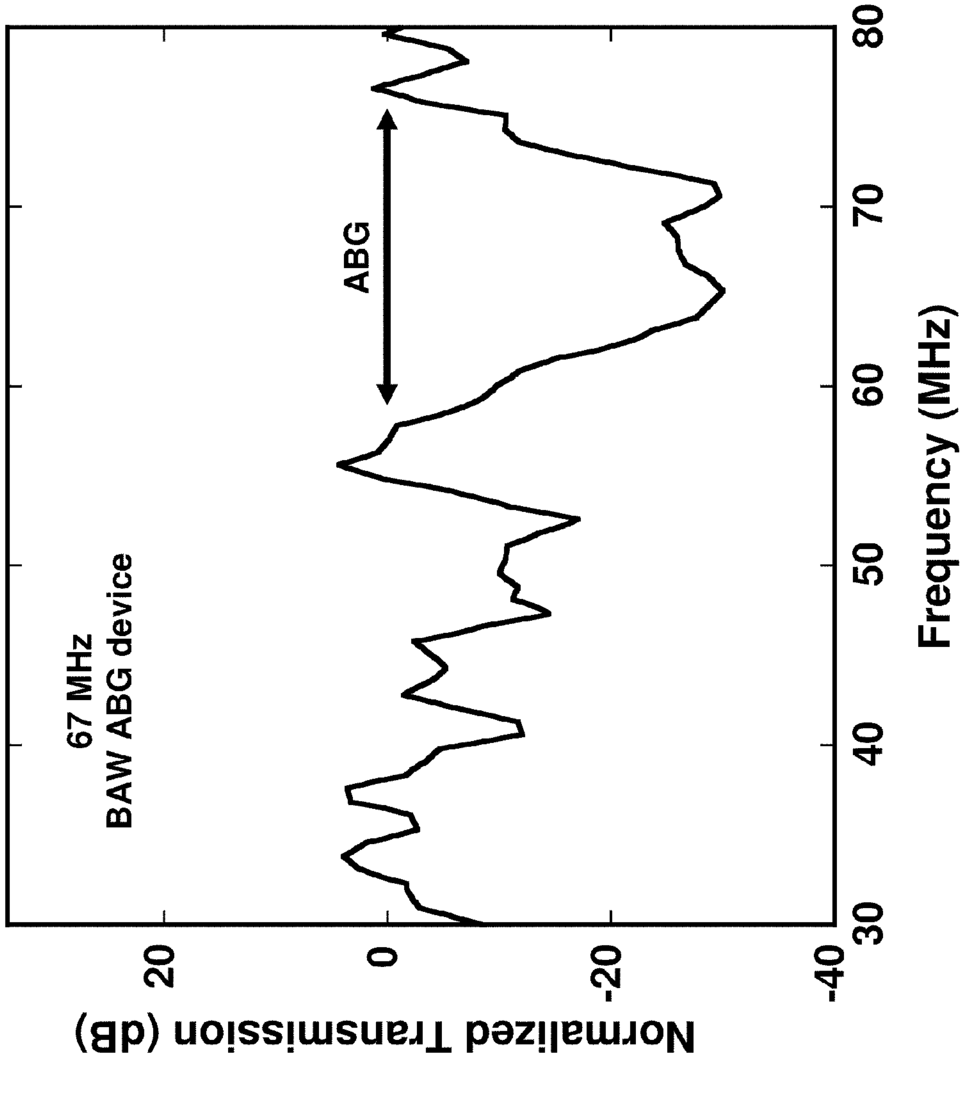
FIG. 6 shows a graph of the normalized transmission of the BAW ABG device shown in FIG. 1.

In FIG. 6 is shown a graph of the normalized transmission for the BAW ABG device, which is derived by dividing the transmission through the BAW ABG device by the transmission through the $SiO_2$ matrix membrane, both shown in FIG. 5. The graph shows an ABG from 59 MHz to 76 MHz, including a portion from 63 MHz to 72 MHz where transmission is attenuated by greater than 25 dB. The gap has a center frequency of $\omega_g$=67.5 MHz and a spectral width of 17 MHz or $(\Delta\omega/\omega_g)$=0.25.

Figure 7:
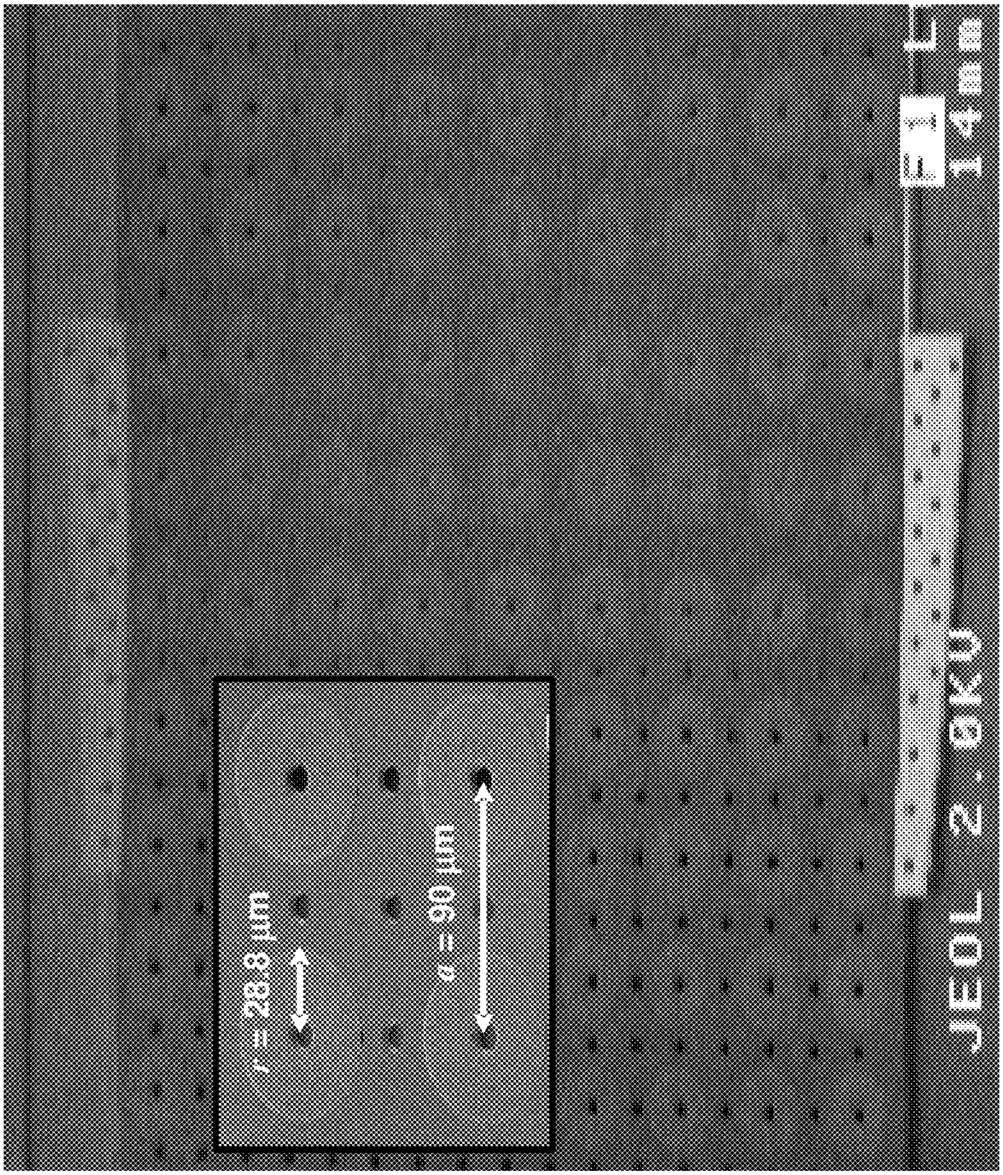
FIG. 7 shows a SEM of BAW ABG device having a center frequency of 33 MHz.

In FIG. 7 is shown a SEM of a BAW ABG device having a center frequency of about 33 MHz. This 33 MHz device has a square lattice and a lattice constant, a, of 90 μm, twice that of the 67 MHz device in FIG. 1 (a=45 μm).

Figure 8:
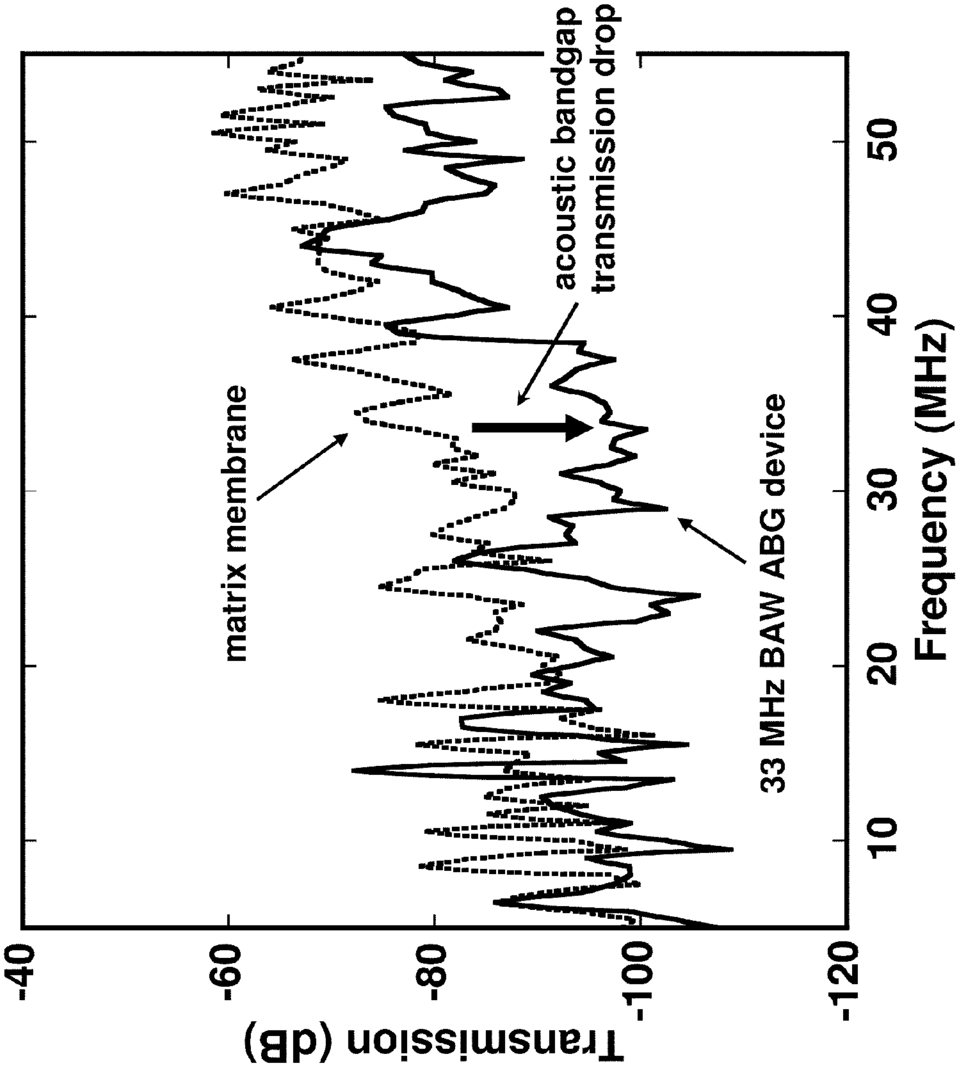
FIG. 8 shows a graph of the measured transmission for the BAW ABG device shown in FIG. 7 and a $SiO_2$ matrix membrane.

In FIG. 8 is shown a graph of the measured transmission for the 33 MHz BAW ABG device and the $SiO_2$ matrix membrane. An acoustic transmission drop is observed for the BAW ABG device between 27 MHz and 39 MHz with a maximum attenuation greater than 30 dB. The gap center frequency is $\omega_g$=33 MHz and the width is 12 MHz yielding $(\Delta\omega/\omega_g)$=0.36. The bandgap region of the 33 MHz device in FIG. 7 is observed at half the frequency of the 67 MHz device shown in FIG. 1, as expected from the doubled lattice constant. In addition, the ABG-induced transmission drops for both devices are centered at a=λ/2, where is the acoustic wavelength in the matrix material and is equal to $$\lambda = \frac{c}{f}, \tag{2}$$

where c is the acoustic velocity in $SiO_2$ and f is the center frequency of the ABG. This result is consistent with the literature where the bandgap is generally centered near $$f = \frac{c}{2a}. \tag{3}$$

If a full acoustic bandgap exists in a phononic crystal, confinement of an acoustic wave can be achieved in waveguides or cavities. Such phononic elements can be realized by breaking the periodicity of the phononic crystal to create highly localized defect or guided modes within the acoustic bandgap. Defects can be produced by removing or modifying the scatterers (for example, by altering the acoustic properties or dimensions) in one or several rows of the periodic array or by changing the lattice constant. For example, an acoustic wave can be guided by extended linear defects that open up passbands that fall within the acoustic bandgap. In particular, phononic waveguides can confine and efficiently guide acoustic waves around sharp bends with much lower loss transmission than conventional waveguides.

Figure 9:
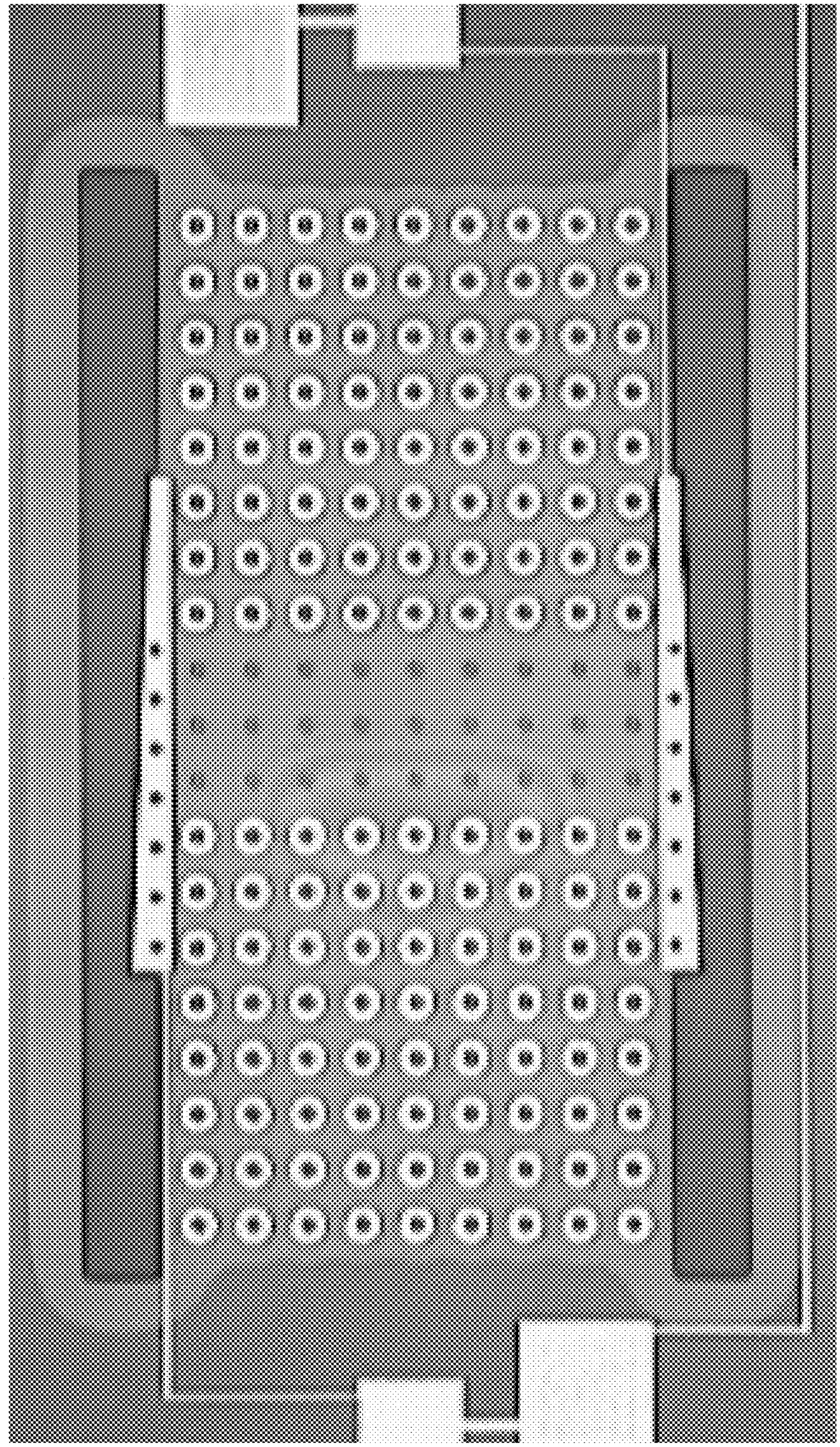
FIG. 9 shows a top-view photograph of a linear W3 phononic waveguide created by the removal of three rows of the tungsten scatterers.

In FIG. 9 is shown a top-view photograph of a linear W3 phononic waveguide created by the removal of three rows of the tungsten scatterers. In general, such a waveguide will support multiple linearly localized guided modes in proportionality with the number of removed rows. By analogy, a W1 waveguide created by the removal of just one row of scattering tungsten rods will support a single guided mode.

Figure 10:
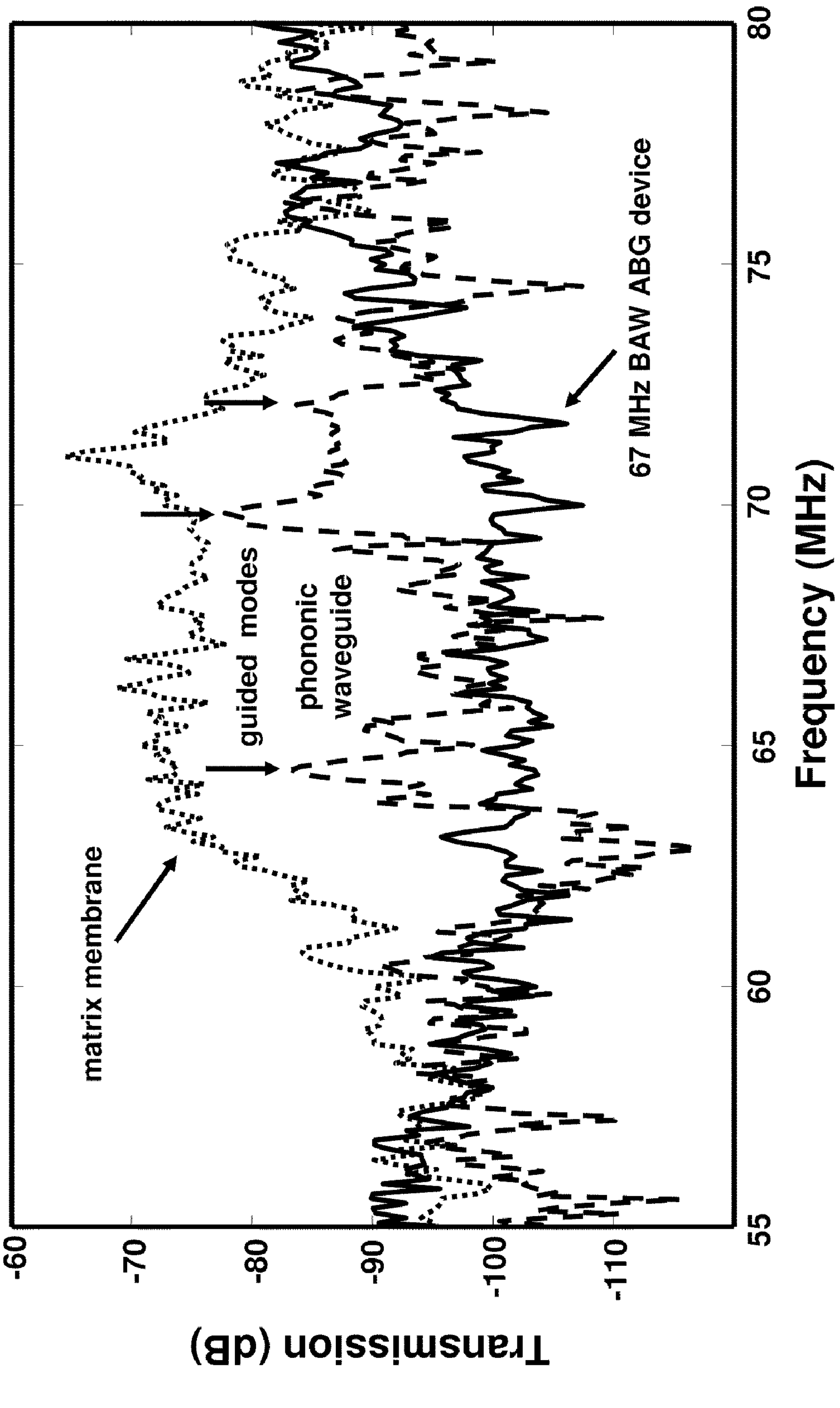
FIG. 10 shows a graph of the transmission responses of the W3 phononic waveguide, the matrix membrane, and a 9-layer square lattice BAW ABG device.

In FIG. 10 is shown a graphical comparison between the transmission response of the W3 phononic waveguide, the matrix membrane, and a 9-layer square lattice BAW ABG device. The figure clearly shows the existence of three guided modes, at 64.5, 69.8, and 72.1 MHz, at which the transmission through the W3 waveguide approaches that of the matrix. Transmission is about 90%-100% for these modes.

Figure 11:
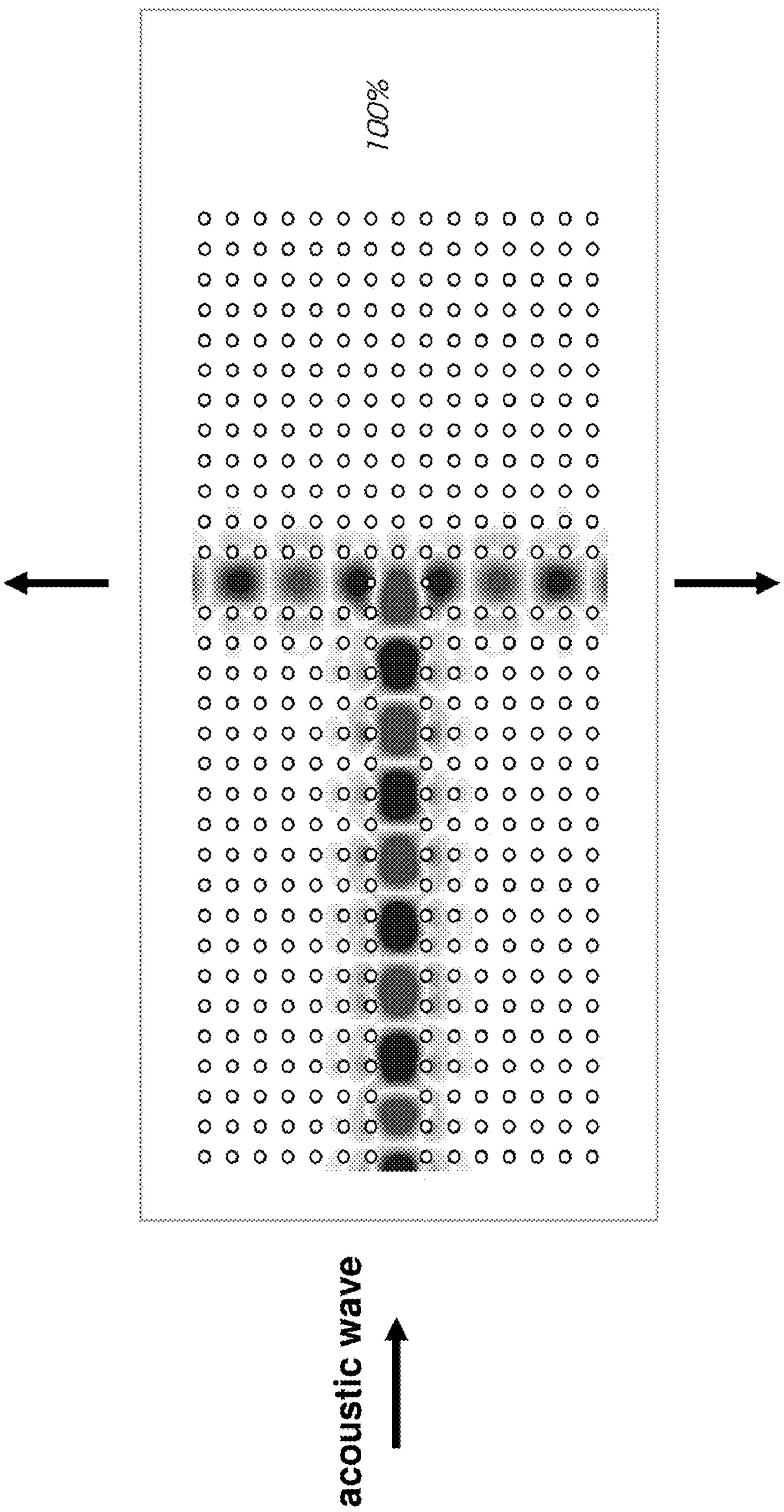
FIG. 11 shows the electric field pattern for a T-shaped phononic splitter.

In FIG. 11 is shown the acoustic field pattern for a T-shaped phononic splitter that splits a guided mode in an input waveguide into two output waveguides through 90° bends. The circles indicate the positions of the scatterer rods. Dark and light regions represent negative and positive fields, while white regions represent zero field. The fields are completely confined within the waveguide regions and split equally into the output waveguides. The splitter structure was modeled as separate waveguide sections in the (01) direction (X-direction) and (10) direction (Y-direction) connected by a short waveguide section in the (11) direction. A similarity homomorphism was used to analogize the modeling of the ABG splitter to modeling of the PBG splitter by Mekis et al. This similarity is possible because the acoustic impedance for an ABG crystal plays the same role as the refractive index for a PBG crystal. See A. Mekis et al., *Phys. Rev. Lett.* 77, 3787 (1996). Alternatively, the splitter can be calculated using the same similarity homomorphism and the modeling of Fan et al. See Fan et al., *J. Opt. Soc. Am. B* 18, 162 (2001). Key to minimizing the back reflection in the input waveguide is the establishment of equal decay rates in each of the three branches of the splitter. This can be established by the insertion of two smaller size rods at the entrance of the splitter branches as shown in FIG. 11.

Evanescent fields extend into the periodic array of scatterers surrounding a waveguide. Therefore, mode coupling can occur between adjacent waveguides though a coupling element which supports localized resonances. This enables phononic channel drop tunneling to selectively transfer one particular acoustic wavelength between two parallel coupled waveguides. In general, a phononic channel drop filter can be realized by two parallel ABG waveguides and a coupling element that comprises two coupled single-mode high-Q microcavity defects.

Figure 12:
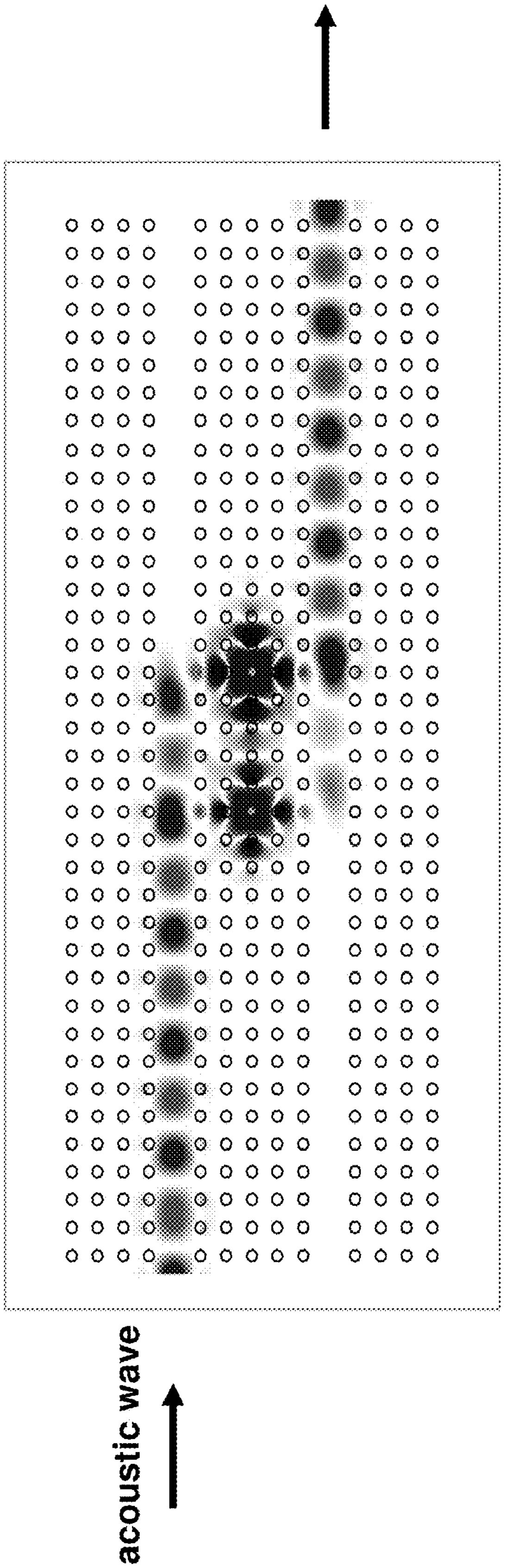
FIG. 12 shows the electric field pattern for a phononic channel drop filter.

In FIG. 12 is shown the acoustic field pattern of a phononic channel drop filter that maximizes transfer efficiency. The ABG crystal is made of a square lattice of high-acoustic impedance rods in a low impedance background matrix. The parallel waveguides are formed by removing two rows of rods, and the microcavities are formed between the waveguides by reducing the radius of two rods. Each cavity is chosen so that it supports a localized monopole state which is singly degenerate. See P. R. Villeneuve et al., *Phys. Rev. B* 54, 7837 (1996). The filter structure was designed to be symmetric with respect to a mirror plane perpendicular to the two parallel waveguides. In general, a propagating mode in the top waveguide can be viewed as being a superposition of two states: a cosine part, which is even with respect to the mirror plane, and a sine part, which is odd. Each state couples only to a state of comparable symmetry. In the specific case where the coupling constants and the frequencies are equal for both modes, a mixed resonant state is excited, which in turn decays only along the forward direction. See S. Fan et al., *Phys. Rev. Lett.* 80, 960 (1998). Frequency degeneracy is enforced between the two modes by reducing the size of four specific rods in the microcavities, as shown in FIG. 12. The quality factor of the two states can be made equal provided that the wave vector k of the guided mode satisfies the relation $kd=n\pi+\pi/2$, where d is the distance between the two defects and n is an integer.

The present invention has been described as a bulk wave acoustic bandgap device. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for fabricating a bulk wave acoustic bandgap device, comprising:

providing a substrate;

forming a release layer on the substrate;

forming a matrix layer comprising a matrix material on the release layer;

forming a two-dimensional periodic array of scatterers within the matrix material, wherein the periodic array comprises a cermet topology and wherein the scatterer material has a higher acoustic impedance than the matrix material; and removing the release layer to release a membrane comprising the matrix material and the periodic array of scatterers within the matrix material, wherein the periodicity of the array causes destructive interference within an acoustic bandgap of a longitudinal acoustic wave that propagates in the plane of the membrane.

2. The method of claim 1, wherein the substrate comprises silicon, semiconductor, glass, ceramic, or metal.

3. The method of claim 1, wherein the scatterer material has a higher density than the matrix material.

4. The method of claim 1, wherein the scatterer material has higher elastic constant than the matrix material.

5. The method of claim 1, wherein the matrix material comprises silicon dioxide, silicon, or polymer.

6. The method of claim 1, wherein the scatterer material comprises tungsten, tungsten carbide, platinum, polycrystalline diamond, or molybdenum.

7. The method of claim 1, wherein the frequency of the acoustic wave is greater than 1 MHz.

8. The method of claim 1, wherein the periodicity of the periodic array is less than 100 microns.

9. The method of claim 1, further comprising forming an etch-stop layer on the substrate prior to forming the release layer.

10. The method of claim 1, wherein the etch-stop layer comprises silicon oxide.

11. The method of claim 1, further comprising forming at least one defect within the periodic array of scatterers.

* * * * *